United States Patent
Banin et al.

(10) Patent No.: US 8,933,322 B2
(45) Date of Patent: Jan. 13, 2015

(54) METHODS, SYSTEMS, AND APPARATUSES FOR ALIGNING LIGHT CONCENTRATOR COMPONENTS WITH A LIGHT SOURCE

(75) Inventors: Yoav Banin, Piedmont, CA (US); Gino D'Ovidio, L'Aquila (IT); Giovanni Lanzara, Rome (IT)

(73) Assignee: Solergy, Inc., Piedmont, CA (US)

( * ) Notice: Subject to any disclaimer, the term of this patent is extended or adjusted under 35 U.S.C. 154(b) by 533 days.

(21) Appl. No.: 12/997,118

(22) PCT Filed: Jun. 11, 2009

(86) PCT No.: PCT/US2009/047054
§ 371 (c)(1),
(2), (4) Date: Dec. 9, 2010

(87) PCT Pub. No.: WO2009/152343
PCT Pub. Date: Dec. 17, 2009

(65) Prior Publication Data
US 2011/0094565 A1    Apr. 28, 2011

(30) Foreign Application Priority Data
Jun. 12, 2008   (IT) ............... AQ2008A0008

(51) Int. Cl.
*H01L 31/052*  (2014.01)
*F24J 2/38*  (2014.01)
(Continued)

(52) U.S. Cl.
CPC ............. *F24J 2/38* (2013.01); *A63B 21/0004* (2013.01); *F24J 2/542* (2013.01); *F24J 2/5431* (2013.01);
(Continued)

(58) Field of Classification Search
CPC ............. F24J 2/38; F24J 2/40; F24J 2/52; F24J 2/54; F24J 2/5417; F24J 2/5431
USPC .............. 136/246; 211/26; 29/428; 126/576
See application file for complete search history.

(56) References Cited

U.S. PATENT DOCUMENTS 3,713,727 A * 1/1973 Markosian et al. ........... 359/853
4,187,123 A   2/1980 Diggs
(Continued)

FOREIGN PATENT DOCUMENTS

EP    0744625    11/1996
ES    2283233    3/2007
(Continued)

OTHER PUBLICATIONS

International Search Report and Written Opinion of PCT/US2009/047054 filed Nov. 6, 2009, 19 pgs.

*Primary Examiner* — Jonathan Johnson
*Assistant Examiner* — Bethany Lambright
(74) *Attorney, Agent, or Firm* — Dean Small; Jason P. Gross; The Small Patent Law Group LLC

(57) ABSTRACT

A tracking system configured to orient light concentrators to face a light source. The system includes a movable support structure for providing global alignment of the light concentrators with the light source. The system also includes a light concentrator (LC) module that is coupled to the support structure and has an array of light concentrators that are in fixed positions with respect to each other. The system also includes a secondary alignment mechanism having a module joint that movably couples the LC module to the support structure and an actuator assembly. The actuator assembly is configured to selectively move the LC module about two axes relative to a pivot point of the module joint thereby orienting the array of light concentrators.

21 Claims, 13 Drawing Sheets

(51) Int. Cl.
  *A63B 21/00* (2006.01)
  *F24J 2/54* (2006.01)
  *H01L 31/042* (2014.01)
  *F24J 2/07* (2006.01)

(52) U.S. Cl.
  CPC ........ *H01L 31/0422* (2013.01); *H01L 31/0522* (2013.01); *F24J 2002/075* (2013.01); *Y02E 10/47* (2013.01); *Y02E 10/52* (2013.01)
  USPC .......... 136/246; 136/244; 52/173.3; 126/576; 211/26

(56) References Cited

U.S. PATENT DOCUMENTS

| | | | |
|---|---|---|---|
| 7,192,146 | B2 | 3/2007 | Gross et al. |
| 2003/0000564 | A1* | 1/2003 | Shingleton et al. ........... 136/244 |
| 2005/0034751 | A1 | 2/2005 | Gross et al. |
| 2005/0034752 | A1 | 2/2005 | Gross et al. |
| 2005/0063078 | A1 | 3/2005 | Willits |
| 2006/0243319 | A1* | 11/2006 | Kusek et al. .................. 136/246 |
| 2006/0283497 | A1 | 12/2006 | Hines |
| 2007/0012349 | A1* | 1/2007 | Gaudiana et al. ............. 136/244 |
| 2007/0070531 | A1* | 3/2007 | Lu ................................. 359/851 |
| 2007/0089778 | A1* | 4/2007 | Horne et al. ................... 136/246 |
| 2007/0215199 | A1* | 9/2007 | Dold et al. ..................... 136/246 |
| 2008/0029151 | A1* | 2/2008 | McGlynn et al. ............. 136/249 |
| 2008/0087321 | A1 | 4/2008 | Schwartzman |
| 2009/0114211 | A1* | 5/2009 | Homyk et al. ................ 126/578 |

FOREIGN PATENT DOCUMENTS

| | | |
|---|---|---|
| GB | 2351551 | 1/2001 |
| JP | 09148610 | 6/1997 |
| WO | 2007041018 | 4/2007 |
| WO | 2007143517 | 12/2007 |
| WO | 2008154110 | 12/2008 |

\* cited by examiner

METHODS, SYSTEMS, AND APPARATUSES FOR ALIGNING LIGHT CONCENTRATOR COMPONENTS WITH A LIGHT SOURCE

CROSS-REFERENCE TO RELATED APPLICATIONS

The present application is a national phase application of international application no. PCT/US2009/47054, having an international filing date of Jun. 11, 2009, which claims priority to Italian Patent Application No. AQ2008A000008, filed Jun. 12, 2008, which is entitled "SISTEMA SECONDARIO DI ATTUAZIONE PER IL PUNTAMENTO DI PRECISIONE, MONTATO SUL TRACKER PER SISTEMI A CONCENTRAZIONE SOLARE, IN GRADO DI EFFETTUARE ROTAZIONI SPAZIALI AL FINE DI ASSICURARE L'ALLINEAMENTO CON I RAGGI SOLARI DEL CONCENTRATORE O GRUPPI DI CONCENTRATORI SERVITI." Each of the above applications is incorporated herein by reference in the entirety.

The present application describes systems, methods, and apparatuses that may be used with embodiments described in U.S. patent application Ser. No. 12/113,788, filed on May 1, 2008, and application Ser. No. 11/963,176, filed on Dec. 21, 2007, both of which are incorporated by reference in the entirety.

BACKGROUND OF THE INVENTION

The invention relates generally to light concentrating systems, and more particularly to light concentrating systems for aligning light concentrator(s) or photovoltaic cell(s) with a light source.

Light concentrating systems exist today for generating electricity and/or thermal energy. Some known systems include an array of light concentrators in which each light concentrator focuses light onto a corresponding focal region where a photovoltaic (PV) cell and/or an element for absorbing thermal energy is located. A light concentrator's efficiency for converting light energy into electrical or thermal energy is significantly based upon how well the light concentrator is aligned with incident light. For example, in some light concentrators, if the angle of incidence of the light rays onto the PV cell is greater than about 0.5-1.0°, the energy conversion efficiency and energy output of the light concentrator reduces exponentially.

However, it may be cost prohibitive to manufacture an alignment device for each light concentrator in the light concentrating system. To reduce the costs, manufacturers have attempted to move several light concentrators at once to align the light concentrators with the light source. In such light concentrating systems that move several light concentrators at once, several challenges may arise that make it more difficult to ensure that all of the light concentrators are properly aligned with the light source.

One challenge is the cost of manufacturing components of the light concentrating systems. Any variations or errors in the manufacturing or design processes of a light concentrating system may lead to the light concentrators being initially misaligned. For example, a light concentrator may be mounted to a holder, which may be mounted onto another structural component that, in turn, is mounted to a support or base. If any of the above elements are misaligned or have substantial manufacturing variances, the light concentrator may not be properly aligned upon installation. Furthermore, different light concentrators may have different orientations with respect to each other (i.e., the light concentrators are not misaligned in the same manner).

Other challenges may occur after the light concentrating systems have been manufactured. For example, systems may experience heavy winds that permanently or temporarily move the light concentrators or deform the structural supports that hold the light concentrators. Likewise, temperature variation throughout the life of the system may cause mechanical elements of the system and light concentrators to expand and contract leading to temporal and/or permanent warping of the mechanical elements. Furthermore, light concentrating systems are often manufactured to be lightweight and wind-resistant or aerodynamic, which, consequently, may lead to the use of mechanical elements that are susceptible to bending. The weight of the light concentrators or other components may cause these mechanical elements to bend or flex during normal course of operation.

In one proposed light concentrating system, a solar energy panel has multiple power generating modules on a flat structural grid that is supported on a post. The panel may move the structural grid about two axes. Each module includes a multitude of lenses and photovoltaic cells that are combined in a common housing. The common housing holds all of the lenses aligned together. Two secondary servomechanisms are mounted in or on the common housing and are capable of moving the common housing about corresponding axes.

However, the above proposed system may have limited abilities in aligning the modules. For example, the flat structural grid may be vulnerable to wind damage or deformation. Also, if one photovoltaic cell or lens in the common housing is defective or becomes damaged, it may be necessary to replace the assembled lenses or the entire housing. Furthermore, the proposed secondary servomechanisms are limited to assembled lenses held in a common housing. The secondary servomechanisms are not applied to individual light concentrators or PV cells.

Thus, there is a need for light concentrating systems, methods, and apparatuses that facilitate aligning a light concentrator(s) or a PV cell(s) with a light source to generate electrical and/or thermal energy. There is also a need for a light concentrating systems, methods, and apparatuses that may reduce the costs of manufacturing by allowing some tolerances in the design and manufacturing of different components. There is also a need for light concentrating systems, methods, and apparatuses that can reduce an amount of time and a skill level required to install, calibrate, and initially orient the light concentrators. Also, there is a need for light concentrating systems, methods, and apparatuses that are capable of aligning a single light concentrator or aligning a single PV cell with a light source.

BRIEF DESCRIPTION OF THE INVENTION

In one embodiment, a tracking system configured to orient light concentrators to face a light source is provided. The system includes a movable support structure for providing global alignment of the light concentrators with the light source. The system also includes a light concentrator (LC) module that is coupled to the support structure and has an array of light concentrators that are in fixed positions with respect to each other. The system also includes a secondary alignment mechanism having a module joint that movably couples the LC module to the support structure and an actuator assembly. The actuator assembly is configured to selectively move the LC module about two axes relative to a pivot point of the module joint thereby orienting the array of light concentrators.

In another embodiment, a method of manufacturing a tracking system configured to orient light concentrators to face a light source is provided. The method includes providing a movable support structure and coupling a secondary alignment mechanism to the support structure. The secondary alignment mechanism has a module joint that is configured to be movably coupled to the support structure and an actuator assembly. The module joint is selectively movable about two axes relative to a pivot point of the module joint by the actuator assembly. The method also includes coupling a light concentrator (LC) module to the module joint. The LC module is configured to hold an array of light concentrators in fixed positions with respect to each other.

In another embodiment, a method of orienting light concentrators to track a light source using a tracking system is provided. The tracking system includes a support structure and a LC module supported by the support structure. The LC module is movably coupled to the support structure by a module joint and has an array of light concentrators. The method includes selectively moving the support structure to globally align the light concentrators with the light source and selectively moving the LC module about two axes relative to a pivot point of the module joint to orient the light concentrators to face the light source.

In yet another embodiment, a tracking system configured to orient at least one light concentrator to face a light source is provided. The system includes a support structure for providing global alignment with the light source. The system also includes a light concentrator that is supported by the support structure and is configured to face the light source. Furthermore, the system includes an actuator assembly and a module joint that couple the light concentrator to the support structure. The actuator assembly is coupled to the light concentrator and is configured to selectively move the light concentrator about two axes relative to a pivot point of the module joint thereby orienting the light concentrator to face the light source.

In another embodiment, a method of orienting a light concentrator coupled to a support structure of a tracking system is provided. The light concentrator is movably coupled to the support structure. The method includes determining a desired orientation of the light concentrator with respect to the support structure and coupling a portable actuator device to the light concentrator and to the support structure. The method also includes moving the light concentrator into the desired orientation using the actuator device and de-coupling the actuator device.

Optionally, the light concentrator may be an array of light concentrators or a light concentrator module that has a plurality of light concentrators.

In yet another embodiment, a light concentrator for converting light into electrical energy is provided. The light concentrator includes an optical element that is configured to direct light toward a focal region. The light concentrator also includes a receiver assembly that is located proximate to the focal region of the optical element. The receiver assembly includes a photovoltaic (PV) cell that is configured to convert the light into electrical energy and also a module joint that is coupled to the PV cell. The module joint selectively moves the PV cell about two axes relative to a pivot point of the module joint to a desired orientation with respect to the light directed toward the focal region.

DETAILED DESCRIPTION OF THE INVENTION

Figure 1:
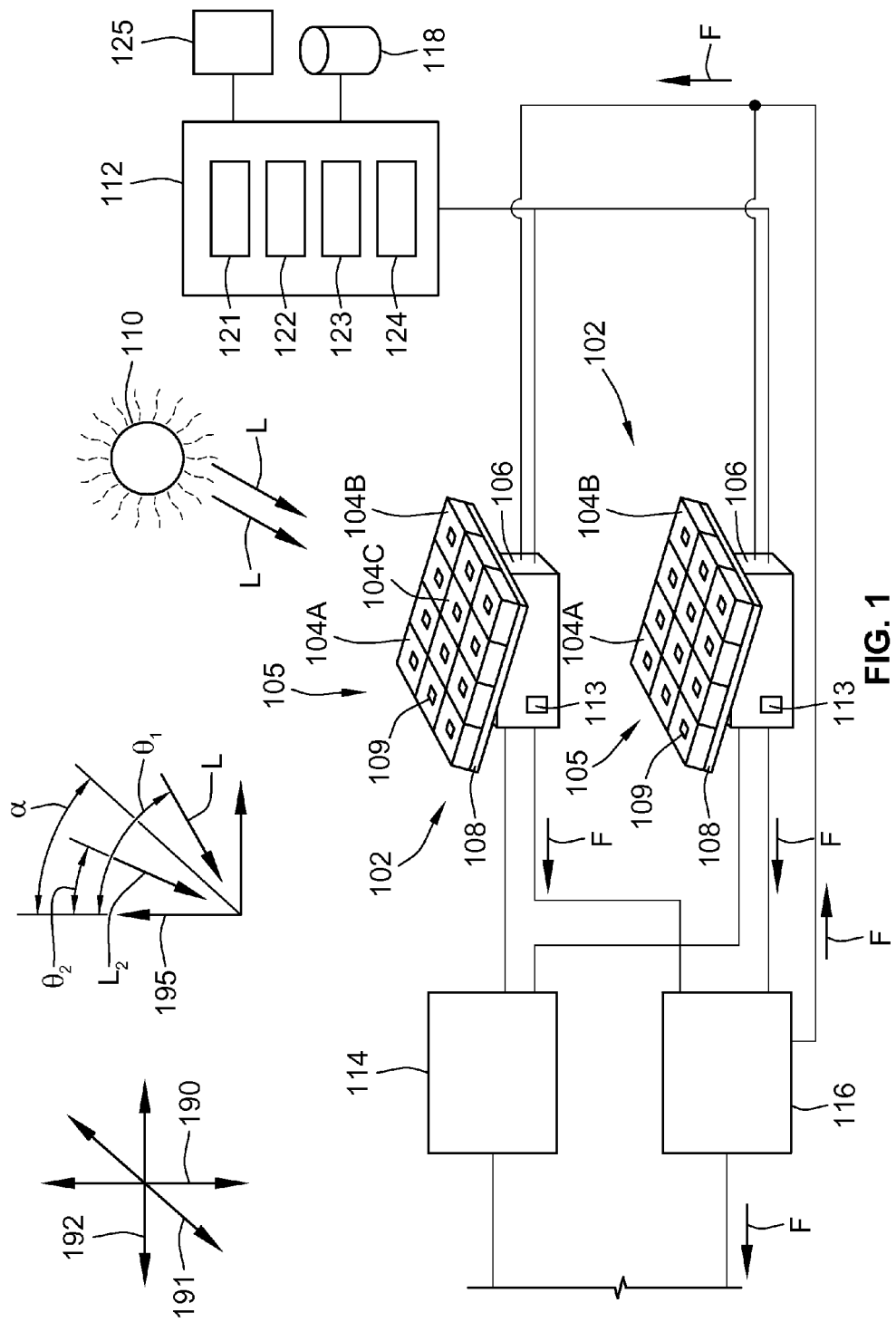
FIG. 1 is a schematic illustration of a light energy conversion (LEC) system formed in accordance with one embodiment.

Embodiments described herein include systems, methods, and apparatuses that may orient or align an array of light concentrators to facilitate converting light energy into electrical energy, thermal energy, or both. The array of light concentrators may be moved initially by a primary or global alignment mechanism to face a light source. One or more sets of light concentrators of the array may then be moved by a secondary or local alignment mechanism to a desired orientation. In other embodiments, the array of light concentrators may be moved initially by a primary or global alignment mechanism, and then one or more individual light concentrators of the array may be moved by respective secondary alignment mechanisms. Furthermore, in other embodiments, individual PV cells may be selectively moved by secondary alignment mechanisms.

As used herein, a "light concentrator" includes at least one optical element having at least one of a reflective surface and a refractive medium that is configured to concentrate light energy onto a corresponding focal region where the light energy may be converted to electricity and/or may be used to heat a working fluid. A light concentrator may have only one optical element or a plurality of optical elements that cooperate with one another to focus the light energy onto the focal region. Exemplary light concentrators are described in U.S. patent application Ser. Nos. 12/113,788 and 11/963,176, which are both incorporated by reference in the entirety.

As used herein, the term "optical element" includes any material or apparatus that affects the propagation of light. An optical element may be configured to reflect light energy or refract light energy or both. As used herein, the term "light" or "light energy," is not limited to visible light or sunlight, but instead encompasses a wide range of wavelengths, as well as electromagnetic radiation of all wavelengths. As used herein, the term "working fluid" is any fluid or gas used to absorb and transfer thermal energy, including water.

As used herein, the term "focal region" is not limited to a focal point or a focal line but may include the region proximate to the focal point or focal line where the light rays are substantially concentrated. A focal region includes a point-focal region, a linear-focal region, and the like. In some embodiments, concentration levels of light rays at the focal region may be about 50× or greater. In more particular embodiments, concentration levels of light rays at the focal region may be about 100× or greater. In yet more particular embodiments, the concentration levels of light rays at the focal region may be about 500× or greater.

Several of the components described herein, such as light concentrators, frame modules, light concentrator (LC) modules, and module joints, may be removably coupled to another component. As used herein, the term "removably coupled" means that a first component may be readily separable from a second component without destroying either of the first and second components. Components are readily separable when the two components may be separated from each other without undue effort or a significant amount of time spent in separating the two components. For example, the components may be coupled to one another using fasteners, such as screws, latches, buckles, and the like, where a technician may uncouple the two components using a tool or the technician's hands. In addition, removably coupled components may be coupled without a fastener, such as by forming an interference or snap fit with respect to each other.

However, in other embodiments, the first and second components may not be readily separable. Thus, as used herein, the term "coupled" includes being "removably coupled" and also includes the first and second components being fused, bonded, or formed together such that uncoupling the two components would damage at least one of the components.

Furthermore, as used herein, the terms "movably coupled" or "rotatably coupled" mean that two components may be moved or reoriented with respect to each other while the two components are coupled. When two components are movably or rotatably coupled together, the two components may or may not be removably coupled. Furthermore, as used herein "coupled" includes two components being coupled together through a reasonable number of intervening components and also includes two components being directly coupled. Two components may be directly coupled if the two components are in contact with each other and/or adjacent to each other with few intervening component(s).

As used herein, a "light concentrator component" includes a PV cell, optical element, light concentrator, a LC module, and the like. As used herein, a "desired orientation" of a light concentrator component includes any orientation that is desired by a system, operator, technician, and the like. A desired orientation of one light concentrator component may include an orientation that produces a maximum energy output for the one light concentrator component and/or may include an orientation that produces a maximum or desired energy output for a system that includes the one light concentrator component. Furthermore, there may be other desired orientations for light concentrator components that do not relate to energy efficiency and/or energy output of the light concentrator component.

FIG. 1 is a schematic illustration of a light energy conversion (LEC) system 100 formed in accordance with one embodiment. The light energy conversion system 100 may include one or more tracking systems 102 having one or more light conversion (LC) modules 104. An array 105 of LC modules 104 is shown in FIG. 1, however, in alternative embodiments, tracking systems 102 may have only one LC module 104. Each LC module 104 may include one or more light concentrators (not shown). The light concentrators are configured to receive light energy from a light source 110 (e.g., the sun) and convert the light energy into at least one of electrical and thermal energy. The LC modules 104 are selectively movable (i.e., capable of being re-oriented) so that each LC module 104 may be moved independently of other LC modules into a desired orientation with respect to the light source 110.

The tracking systems 102 may also include a tracker base 106 coupled to a support structure 108 that is configured to support the array of LC modules 104 thereon. The tracker base 106 and the support structure 108 may be separately movable. For example, the tracker base 106 may be rotated about a vertical axis 190 thereby moving the support structure 108 and the LC modules 104 thereon. The support structure 108 may also be rotated about at least one of axes 190-192 thereby moving the LC modules 104. In some embodiments, the support structure 108 and the tracker base 106 form a primary or global alignment mechanism configured to align the array 105 of LC modules 104 with the light source 110. Accordingly, the support structure 108, the tracker base 106, and the individual LC modules 104 may cooperate with one another to orient the light concentrators into a desired orientation.

The tracking systems 102 may also include orientations sensors or detectors 109. An orientation detector 109 is configured to receive and transmit data that may facilitate determining a desired orientation of the LC module 104. For example, the orientation detector 109 may be a light sensor having a fixed relationship with respect to a corresponding object (e.g., LC module 104, light concentrator, or support structure 108). In other embodiments, the orientation detector 109 may be a voltage sensor or current sensor used to detect and transmit data relating to an energy output or efficiency of the light concentrators of the LC modules 104. The voltage sensor or current sensor may be used to determine an energy output or efficiency of a single light concentrator, a group of light concentrators, one LC module, or a group of LC modules. As shown in FIG. 1, each LC module 104 may have a single corresponding orientation detector 109. However, in alternative embodiments, an orientation detector 109 may be associated with a set of LC modules 104 or the tracking system 102 may have only one orientation detector 109. Furthermore, a plurality of orientations detectors 109 may be used with a single light concentrator, a group of light concentrators, a single LC module 104, or a group of LC modules 104. Orientation detectors may not only be used in the operation of the tracking system 102, but may also be used to facilitate installing, calibrating, and/or in the maintenance of a single light concentrator, a group of light concentrators, a single LC module 104, or a group of LC modules 104.

The tracking systems 102 are communicatively coupled (e.g., through cables or wireless communication) to a system controller 112. The system controller 112 may be configured to selectively control an orientation of the tracker base 106, the support structure 108, and/or the LC modules 104. The system controller 112 may also obtain other information regarding a state or condition of the tracking system(s) or other data that may be desired by a user of the LEC system 100. More specifically, the system controller 112 may include a database or storage device 118 and several modules 121-124 for operating the tracking systems 102. The system controller 112 may include a diagnostic module 121, an orientation module 122, a source locating module 123, and an event notification module 124. Each of the modules 121-124 may receive data from the tracking systems 102 and transmit instructions or data to the tracking systems 102. Furthermore, each of the modules 121-124 may communicate with each other and store and retrieve information from the storage device 118. The system controller 112 may also be communicatively coupled to a user interface 125. The user interface 125 may be remotely located and be, for example, a desktop computer or workstation, laptop, or a personal handheld device.

The diagnostic module 121 may be configured to determine at least one of an energy production output and an energy conversion efficiency for the LEC system 100, for a single tracking system 102 or a predetermined group of tracking systems 102, or for a single LC module 104 or a predetermined group of LC modules 104. The orientation module 122 is configured to determine and control the orientation of the tracking systems 102 and, in particular, the LC modules 104 with respect to certain objects (e.g., the support structure 108 or the light source 110). The source locating module 123 is configured to determine a spatial location of the light source 110 with respect to a light concentrator component or a tracking system. Furthermore, the event notification module 124 is configured to send instructions or notifications to the tracking systems 102 or the user interface 125 when predetermined events or thresholds have occurred. For example, a notification may be sent to the user interface 125 if operation of a tracking system has failed or if the energy output of the tracking system(s) has dropped below a predetermined level.

The modules 121-124 may use data obtained from the tracking systems 102, data entered through the user interface 125, or data from the storage device 118 to operate the tracking systems 102 at a maximum or a desired efficiency. The system controller 112 may be configured to operate only one tracking system 102 or several tracking systems 102 at once. As shown, the system controller 112 may be remotely located from the tracking systems 102.

Optionally, each tracking system 102 may have a corresponding local controller 113 that is configured to operate similarly as the remote system controller 112 described herein. Each local controller 113 may selectively control the orientation of the LC modules 104 (or light concentrators or PV cells) of the corresponding tracking system 102. A local controller 113 may operate autonomously with little communication or instruction from the system controller 112. For example, a local controller 113 may be configured to automatically control the operation of the corresponding tracking system 102 for a predetermined period of time or until an event has occurred that requires further instructions, information, or analysis. Each local controller 113 may communicate with a system controller, such as the remote system controller 112, that is configured to supervise the operation of the tracking systems 102. For example, local controllers 113 may send event notifications to the system controller 112 and request further instruction.

Electrical energy produced by a tracking system 102 may be delivered to, for example, a power grid 114 for distributing the converted electrical energy. Thermal energy produced by the tracking system 102 may be carried by a working fluid F through a fluidic circuit to a fluid conversion system 116. Although not shown, the fluid conversion system 116 and the fluidic circuit may include pumps, valves, tanks, and/or other fluidic devices that facilitate regulating the flow of the working fluid F. The fluid conversion system 116 may also store the heated working fluid F and/or direct the flow of the working fluid F to other locations where, for example, the working fluid F may be used for heating.

To globally align the array 105 of LC modules 104 with the light source 110, the system controller 112 may take an initial scan of surrounding space (e.g., the sky) for where the light source 110 is expected to be. For instance, the source locating module 123 may use embedded astronomical tables that contain coordinates of the expected location of the light source 110. After the initial scan, the source locating and orientation modules 123 and 122 may communicate with each other to coarsely or globally align the array 105 of LC modules 104 with the light source 110.

In other embodiments, each tracking system 102 may include an inverter that converts the direct current (DC) to alternating current (AC). Readings of the alternating current by the system controller 112 and/or local controller 113 may be made to determine an energy output of the corresponding tracking system 112 at a particular orientation. When the tracking system 102 is moved to a different orientation to globally align the array 105, the alternating current will change thereby indicating whether the array 105 is more closely aligned with the light source 110 or further misaligned. The system controller 112 and/or the local controller 113 may use a feedback protocol using the readings of the AC and selectively move the tracking system 102 to determine if the array 105 is globally aligned. Furthermore, light sensors may be used by tracking systems 102 to globally align the array 105 of LC modules 104 with the light source 110.

A light concentrator component (e.g., a PV cell, a light concentrator, a LC module, and the like) efficiently converts light energy to electrical or thermal energy when impinging light rays L form an incident angle $\theta$ with respect to an alignment axis 195 of the light concentrator component that is within an acceptance angle $\alpha$ of the light concentrator component. The alignment axis 195 of a light concentrator component represents the axis that, if the incident angle $\theta$ of the light rays L were perfectly aligned with the alignment axis 195 (i.e., where $\theta=0$), the light concentrator component would be most efficient. The acceptance angle $\alpha$ represents a critical angle that determines whether the light concentrator component can convert light energy efficiently. For example, if the incident angle $\theta$ is greater than the acceptance angle $\alpha$ (as shown by $\theta_1$ in FIG. 1), then the light concentrator component is misaligned with the light source. If the incident angle $\theta$ is less than the acceptance angle $\alpha$ (as shown by $\theta_2$), then the light concentrator component is operating efficiently. By way of example, the incident angle $\theta$ is within the acceptance angle $\alpha$ if the light concentrator component is operating equal to or greater than 90% maximum efficiency.

As noted above, the alignment axis 195 may be associated with a PV cell, light concentrator, or an LC module. For various reasons, an alignment axis of a light concentrator may not be collinear with or extend parallel to an alignment axis of a PV cell or a LC module. For example, each light concentrator of an LC module may have a corresponding alignment axis. However, due to warping of the LC module or errors in the manufacturing of the individual light concentrators or PV cells, the alignment axes of the light concentrators (which represent the orientation where the light concentrators are most efficient) may not be parallel to each other. As such, the alignment axis of the LC module represents the orientation of the LC module where the LC module is most efficient even if some of the light concentrators of the LC module are not most efficient.

By way of another example, one or more of the alignment axes of the LC modules 104 may not be aligned with the light rays L after the tracking system 102 has globally aligned the array of LC modules 104. For instance, the light rays L may form an incident angle (e.g., 1.2°) that is greater than the acceptance angle (e.g., 1.0°) for the LC modules 104A and 104B. However, the light rays L may form an incident angle (e.g., 0.6°) that is less than the acceptance angle (e.g., 1.0°) for the LC module 104C. In such cases, the orientation detector 109 associated with the misaligned LC modules 104A and 104B may send alignment data to the remote system controller 112 and/or the local controller 113. The alignment data may relate to, for example, light rays L impinging upon light sensors. Alternatively, the alignment data may relate to current, voltage, or power readings of the LC modules (or components thereof) that suggest or indicate that the incident angle is not within the acceptance angle of the LC modules 104A and 104B.

The orientation and source locating modules 122 and 123 receive the alignment data and determine that the LC modules 104A and 104B are not properly aligned with the light source 110. The orientation and source locating modules 122 and 123 may then selectively move the misaligned LC modules 104A and 104B (e.g., through actuators, servomechanisms, motors, and the like) so that the incident angle of the light rays are within the acceptance angle. In other words, the alignment axes of the misaligned LC modules 104A and 104B may be moved until the alignment axes of the LC modules 104A and 104B are aligned with the light rays L (i.e., within the acceptance angle or are operating at a desired energy efficiency or output). The alignment axes of the LC modules 104A and 104B may be moved different degrees with respect to the original position or orientation of the corresponding alignment axis. To this end, the controllers 112 and/or 113 may conduct a feedback protocol using the orientation detector(s) 109 to determine when the LC modules 104A and 104B are aligned with the light source 110.

Furthermore, in some embodiments, the tracking system 102 may include one or more LC modules (e.g., LC modules 104A and 104B in FIG. 1) that are selectively movable by a secondary alignment mechanism and one or more LC modules (e.g., 104C) that are fixed with respect to the support structure (i.e., do not have a secondary alignment mechanism, but may still be globally aligned with the other LC modules). For instance, the LC module 104C may be attached to the support structure 108 at a spatial location that provides sturdier support for the LC module 104C than the support structure provides for the LC modules 104A and 104B at other spatial locations. For example, the LC module 104C may be attached to a center of the support structure or to a mechanical element that provides sturdy support, whereas the LC modules 104A and 104B may have a peripheral location that is more vulnerable to wind or may be attached to weaker mechanical elements that warp or bend during the lifetime of the tracking system 102. Accordingly, secondary alignment mechanisms may be coupled to a select number of the total LC modules 104 on the tracking system 102.

Figure 2:
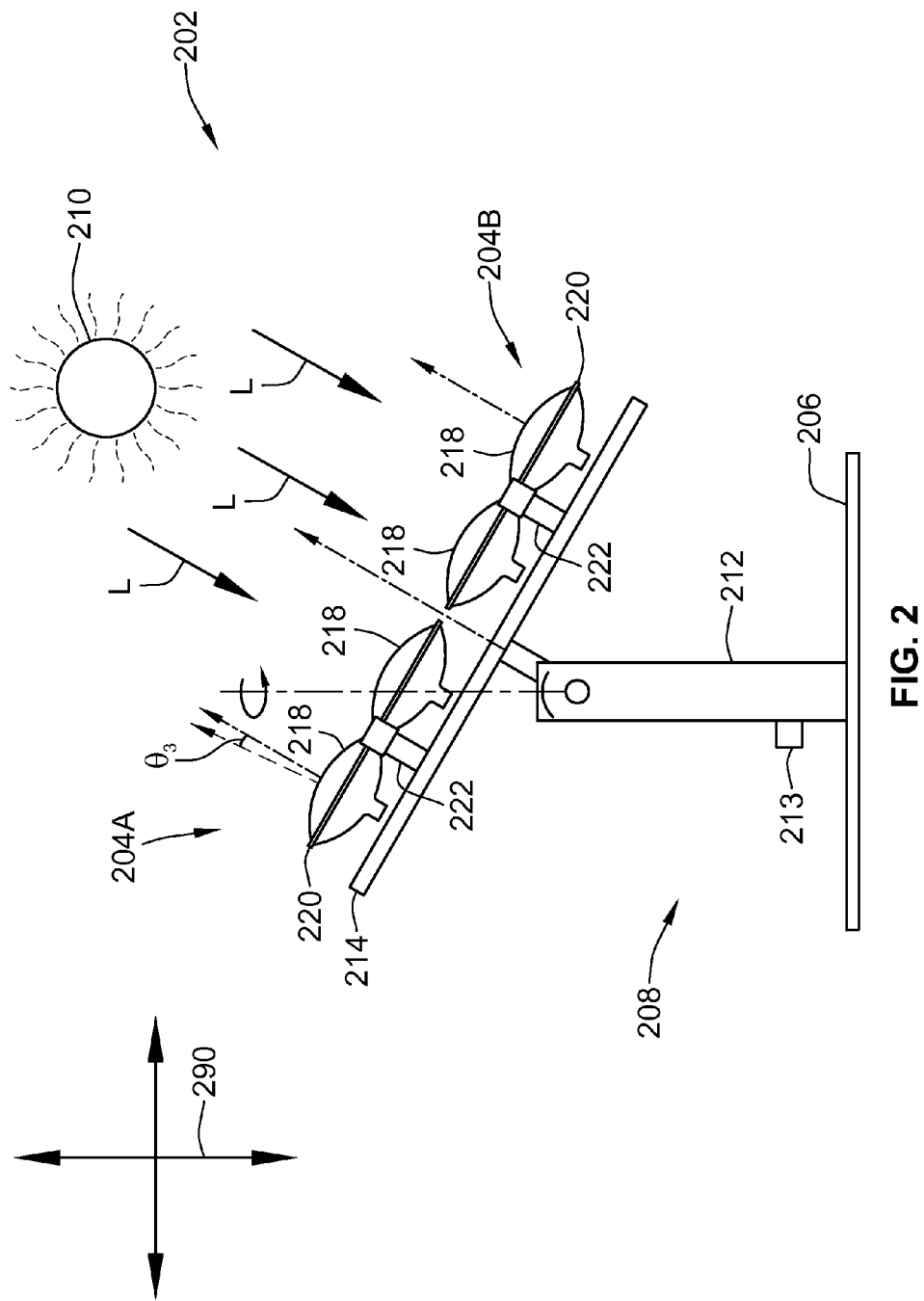
FIG. 2 is a side view of a tracking system formed in accordance with one embodiment.

FIG. 2 is a side view of a tracking system 202 formed in accordance with one embodiment. The tracking system 202 may be used in a light energy concentrating (LEC) system, such as the LEC system 100 described with reference to FIG. 1. As shown, the tracking system 202 includes a movable support structure 208 that is coupled to a tracker base 206. The support structure 208 includes a post 212 that extends along a vertical axis 290 and a panel structure 214 that is movably coupled to a post 212. The panel structure 214 extends along a plane that is configured to face a light source 210. The tracking system 202 also includes an array of LC modules 204 that include a plurality of light concentrators 218 held by a frame module 220 in fixed positions with respect to each other. The frame module 220 is configured to have the structural integrity and features for holding the light concentrators in fixed positions with respect to each other.

The frame modules 220 may be removably coupled to the panel structure 214 by module joints 222. The module joints 222 are configured to move or allow the respective frame modules 220 to be moved in order to align the LC modules 204 with the light source 210. The module joint 222 may be, for example, a universal joint (e.g., a Cardan joint). In other embodiments, the module joint 222 may be formed from flexible materials, e.g., rubber. The module joint 222 may removably couple the LC module 204 to the panel structure 214. If a LC module 204 is operating inefficiently, is damaged, or requires replacing, the individual may remove the LC module 204 and replace the LC module 204 with another version. For example, if a local controller 213 determines that the LC module 204 is no longer operating efficiently, a technician may replace the LC module 204. Alternatively, individual light concentrators 218 may be replaced.

The tracking system 202 may be communicatively coupled to a remote system controller (not shown), such as the system controller 112 (FIG. 1). The system controller and/or the local controller 213 are configured to selectively move the support structure 208 to globally align the LC modules 204 with respect to the light source 210. For example, the post 212 may be rotated about a vertical axis 290 (i.e., azimuthally rotated) and the panel structure 214 may be rotated about another axis that extends into the page (i.e., zenithally rotated) to globally align the array of LC modules 204. When the array of LC modules 204 is globally aligned with the light source 210, one or more of the LC modules 204 may be in a desired orientation with respect to the incident light rays L while one or more of the LC modules 204 may be misaligned. For example, the LC module 204B may be in the desired orientation (i.e., aligned with the light source 210) and the LC module 204A may be misaligned (i.e., an incident angle $\theta_3$ of the LC module 204A may be greater than an acceptance angle (not shown) of the LC module 204A (e.g., greater than 0.7°). As will be discuss in greater detail below, the LC module 204A may be moved or reoriented by a secondary or local alignment mechanism. Accordingly, LC modules 204A and 204B may have different orientations with respect to the support structure 208 in order for both LC modules 204A and 204B to be aligned with the light source 210.

Figure 3:
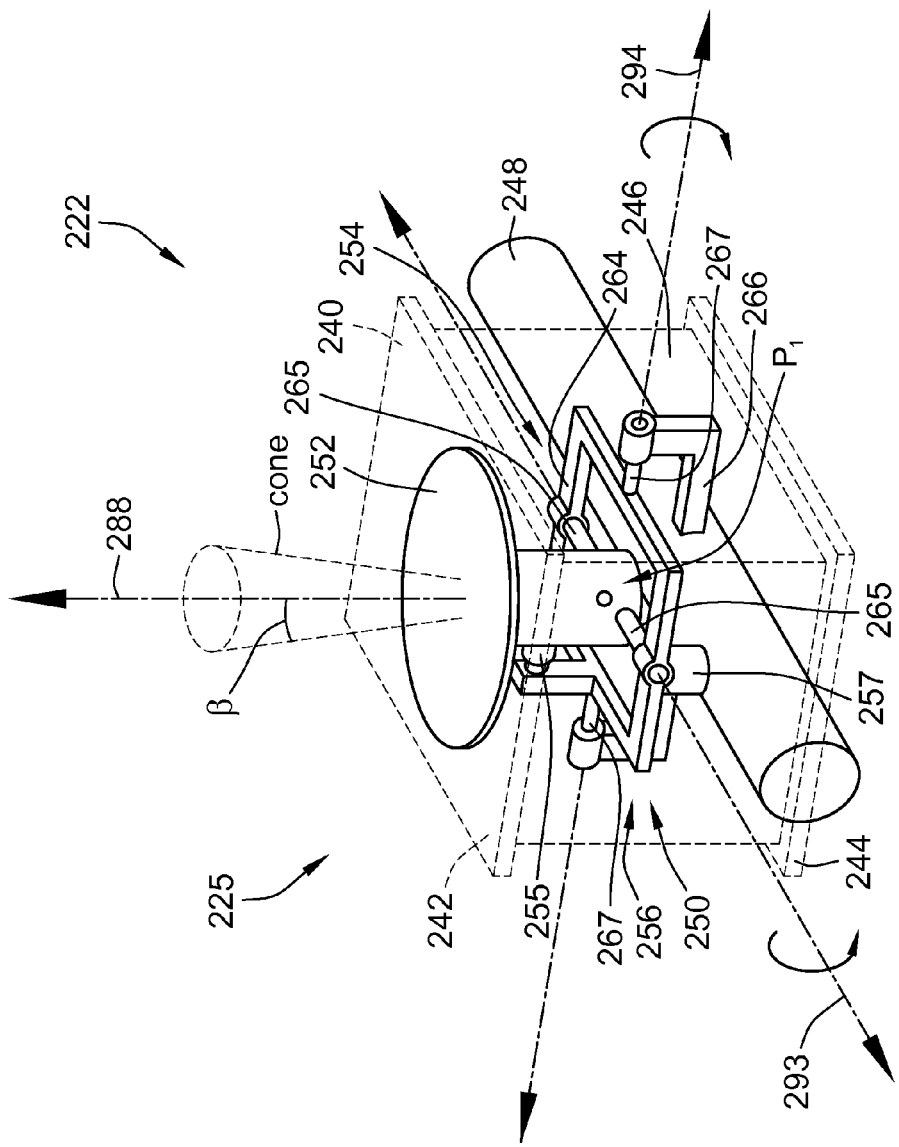
FIG. 3 is an isolated perspective view of a module joint that may be used with the tracking system of FIG. 2.

FIG. 3 is an isolated perspective view of the module joint 222 that may be used with a secondary alignment mechanism or assembly 225 for aligning the LC module 204A (FIG. 2). The module joint 222 includes a housing 240 having a pair of connecting elements 242 and 244 and sidewalls 246 extending therebetween. The connecting element 242 may be, for example, a base plate configured to be coupled to and support a frame module 220 (FIG. 2). The connecting element 244 may couple the housing 240 to a beam 248 of the panel structure 214 (FIG. 2). The sidewalls 246 may be flexible and function as bellows thereby allowing the module joint 222 to change orientations to move the frame module 220.

The module joint 222 may also include an actuator assembly 250 within the housing 240 that is coupled to a module base 252. The module base 252 may be coupled to and structurally support the connecting element 242 or, more directly, the frame module 220. As shown in FIG. 3, the actuator assembly 250 may include hinges 254 and 256 and actuators 255 and 257 that are configured to rotate the module base 252 about axes 293 and 294. The hinge 254 may include a mounting bracket 264 and one or more rods 265 that are secured to the module base 252, and the hinge 256 may include a mounting bracket 266 and one or more rods 267 that are secured to the hinge 254.

The actuators 255 and 257 may be linear actuators having pistons or arms (not shown) that are configured to move a distance between extended and retracted positions. The actuators 255 and 257 may also be communicatively coupled to a controller. To move or re-orient the module base 252, the arm of the actuator 255 may move between the extended and retracted positions to rotate the module base 252 about the axis 293. The arm of the actuator 257 may move between the extended and retracted positions to rotate the mounting bracket 264 (and thereby the module base 252) about the axis 294. The module base 252 may extend along and face a direction that extends along a pointing axis 288. When the actuators 255 and 257 are in a home position (e.g., halfway between the extended and retracted positions), the pointing axis 288 may have be centered with respect to possible orientations (indicated by the cone). When the pointing axis 288 is in a centered position, a range of possible orientations for the pointing axis 288 may be symmetric about the centered pointing axis 288.

After the support structure 208 (FIG. 2) has globally aligned the array of LC modules 204, the actuators 255 and 257 may cooperate with one another to move the pointing axis 288 about a pivot point $P_1$ of the module joint 222. The pivot point $P_1$ may exist at an approximate intersection of the axes 293 and 294 and the point axis 288. As shown in FIG. 3, the pivot point $P_1$ in some embodiments may be located within the housing 240 of the module joint 222 proximate to the beam 248 of the panel structure 214.

As shown in FIG. 3, the pointing axis 288 may be moved an angle β away from the pointing axis 288 in the centered position. For example, the angle β may be an angle less than 5.0° from the pointing axis 288 in the centered position. More specifically, the angle β may be an angle less than 2.0°. The angle β may be determined by a distance in which the arms of the actuators 255 and 257 may be moved between the retracted and extended positions. In the illustrated embodiment, the distances in which the actuators 255 and 257 may linearly move are substantially equivalent. As such, a range of possible orientations of the pointing axis 288 may be represented by a cone having a substantially circular cross-section. However, in alternative embodiments, the distances in which the actuators 255 and 257 may move may be different such that the cone has an oval-shaped cross-section.

Accordingly, the alignment axes of the LC modules 204 and corresponding light concentrators 218 (FIG. 2) may be moved, if desired, the angle β after the LC modules 204 have been globally aligned with the light source 210. More specifically, the actuator assembly 250 may selectively move the frame module 220 about the axes 293 and 294 relative to the pivot point $P_1$ of the module joint 222 thereby orienting the light concentrators 218 coupled to the frame module 220.

Accordingly, the module joint 222 having the actuator assembly 250 may form the secondary alignment mechanism 225. In alternative embodiments, the secondary alignment mechanism 225 may include a module joint and an actuator assembly that is not housed within the module joint (i.e., the module joint and actuator assembly may be separate from each other).

Figure 4:
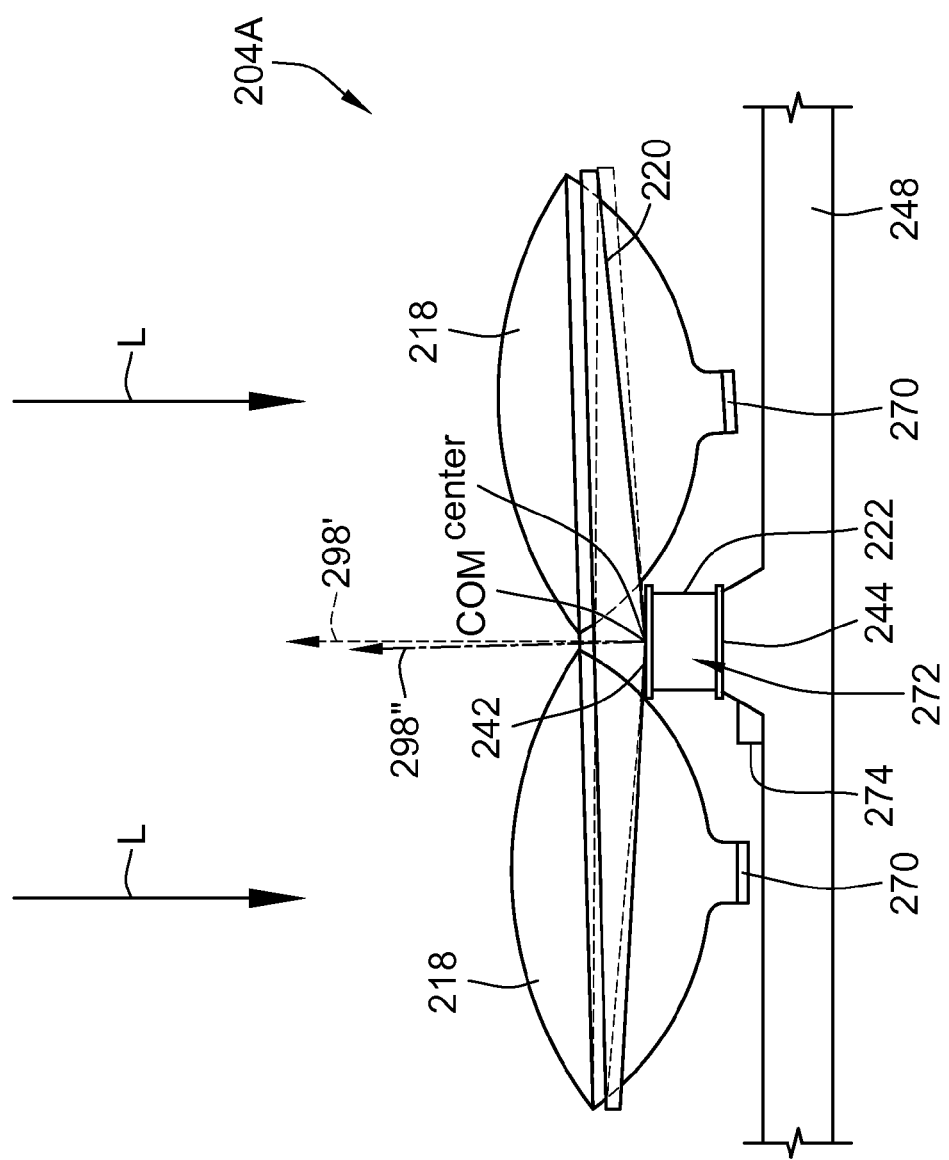
FIG. 4 is a side view of a light concentrator (LC) module that may be used with the tracking system of FIG. 2.

FIG. 4 is an enlarged side view of the LC module 204A. As shown, the frame module 220 is coupled to the module joint 222 via the connecting element 242, and the module joint 222 is secured to the beam 248 via the connecting element 244. As such, the module joint 222 may be secured to the frame module 220 at a single spatial location 272. The single spatial location 272 may be centrally located with respect to dimensions of the frame module 220. Alternatively or in addition, the LC module 204A may have a center of mass (COM) and the module joint 222 may be coupled proximate to the COM. In the embodiment shown in FIG. 4, the COM of the LC module 204A and a center of the frame module 220 are located at approximately the same location (e.g., proximate to the single spatial location 272). However, in alternative embodiments, the COM and the center of the frame module 220 are not at the same location.

As shown in FIG. 4, the alignment axis 298 of the LC module 204A or the frame module 220 may be moved from a first orientation or position 298' to a different second orientation or position 298". In the first orientation 298', the light rays L may form an incident angle (not shown) that is not within the acceptance angle (not shown) thereby resulting in an inefficient conversion of the light energy. The module joint 222 may be selectively moved by a local sub-controller 274, the local controller 213 (FIG. 2), and/or a system controller (not shown) to move the frame module 220 so that the alignment axis of the frame module 220 has the second orientation 298". The light rays L may now form an incident angle that is within the acceptance angle of the LC module 204A. Although not shown, the LC module 204A may include a light sensor configured to detect or receive alignment data to facilitate determining the incident angle at which the light rays L impinge upon the PV cells 270. Alternatively, the LC module 204A may include a current or voltage detector that receives readings associated with the current or voltage of the PV cells to determine if the LC modules 204A are operating at an acceptable conversion efficiency.

Figure 5:
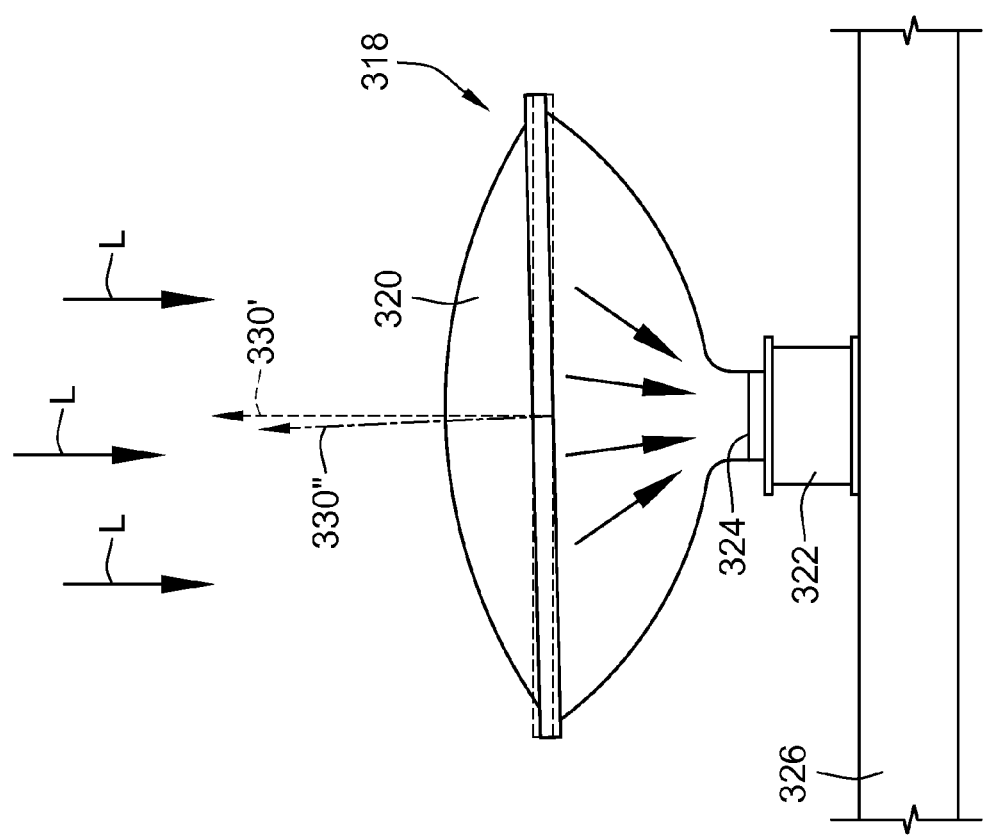
FIG. 5 is a side view of a light concentrator that may be used with the tracking system of FIG. 2.
Figure 6:
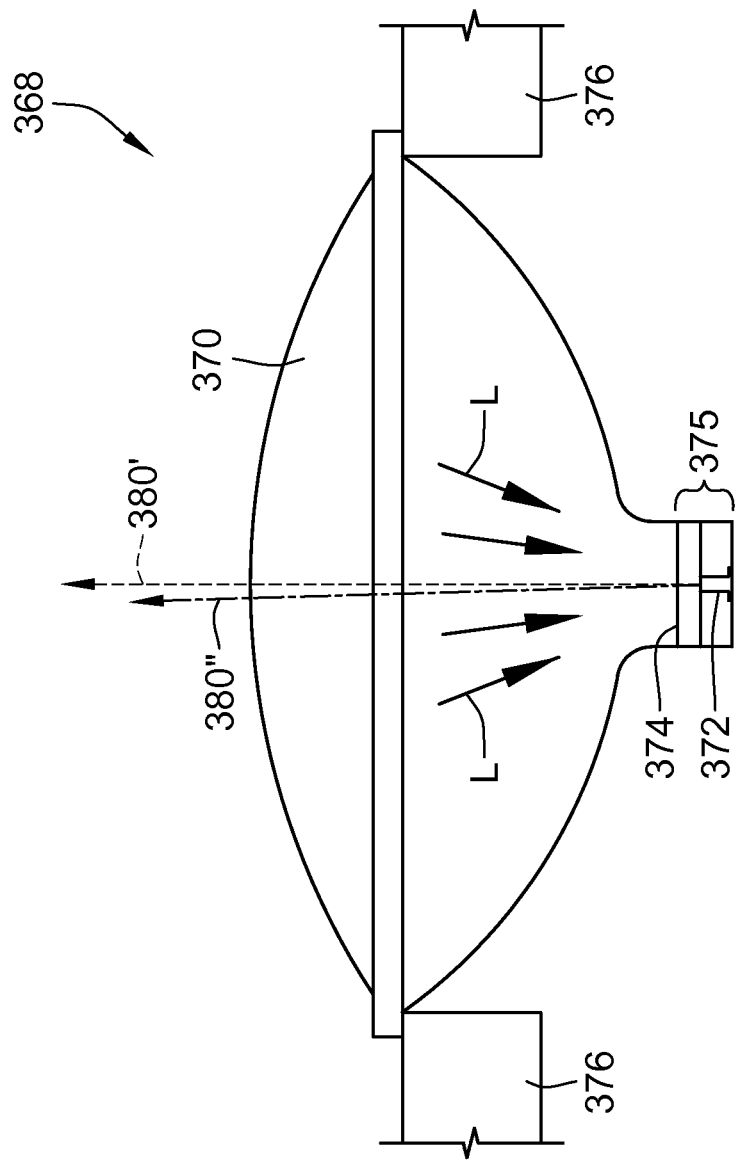
FIG. 6 is a side view of another light concentrator that may be used with the tracking system of FIG. 2.

FIGS. 5 and 6 illustrate module joints 322 and 372, respectively, that may be used with alternative embodiments. FIG. 5 is a side view of a light concentrator 318 that may be used with a tracking system, such as the tracking system 202 (FIG. 2). The light concentrator 318 includes an optical element 320 that is configured to direct light toward a PV cell 324. The light concentrator 318 may be directly and removably coupled to a support structure 326 through the module joint 322. The module joint 322 may have similar features and functions as the module joint 222 and include an actuator assembly (not shown) for moving the light concentrator 318. In alternative embodiments, the module joint 322 may be a flexible material and the light concentrator 318 may be moved by actuators (not shown) that are directly coupled to the optical element 320.

As shown, the optical element 320 may have an alignment axis 330. If the light rays L are aligned with the alignment axis at a first orientation or position 330', then the light rays L would be directed (i.e., reflected and/or refracted) by the optical element 320 and impinge upon the PV cell 324 in a desired manner for efficiently converting the light energy to electrical energy. However, if the alignment axis in the first orientation or position 330' is not aligned with the light rays L, the module joint 322 may move the alignment axis to a different second orientation or position 330" that is aligned with the light rays L (i.e., the incident angle is within the acceptance angle of the optical element 320).

FIG. 6 is a side view of another light concentrator 368 that may be used with a tracking system, such as the tracking system 202 (FIG. 2). The light concentrator 368 includes an optical element 370 that is configured to direct light energy toward a PV cell 374. Unlike previously described LC modules and light concentrators, the optical element 370 may have a fixed orientation with respect to a support structure 376. The optical element 370 may be removably coupled to the support structure 376. However, the light concentrator 368 may include a receiver assembly 375 comprising the PV cell 374 that is supported by and selectively moved by the module joint 372. The module joint 372 may have similar features and functions as the module joint 222. By way of example, if the PV cell 374 is not operating above a threshold efficiency level, the module joint 372 may move the PV cell 374 to a desired orientation. More specifically, the module joint 372 may move the PV cell 374 so that the alignment axis 380 of the PV cell is moved from a first orientation or position 380' to a different second orientation or position 380" where the PV cell 374 is in a desired orientation with respect to the optical element 370.

Figure 7:
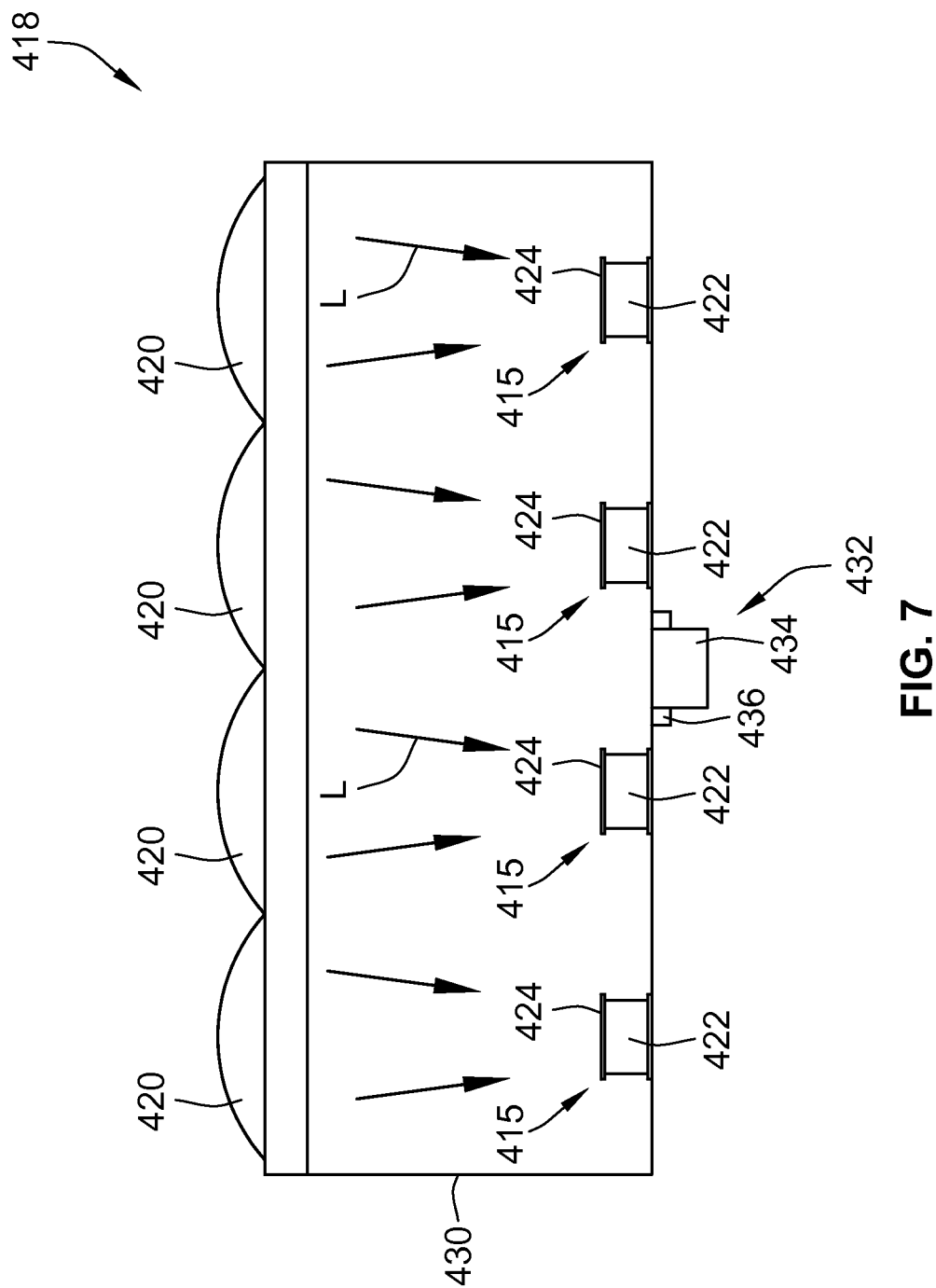
FIG. 7 is a side view of a light concentrator that has a plurality of optical elements and photovoltaic (PV) cells.

FIG. 7 is a side view of a light concentrator 418 formed in accordance with an alternative embodiment. The light concentrator 418 includes an array of optical elements 420 and an array of receiver assemblies 415 mounted to a common housing 430. The common housing 430 may be mounted to a tracking system, such as the tracking system 202 (FIG. 2). The receiver assembly 415 may include a PV cell 424 coupled to a corresponding module joint 422. Each optical element 420 is configured to direct light rays L toward an associated PV cell 424 of the corresponding receiver assembly 415. As such, the light concentrator 418 may also be referred to as a LC module since the light concentrator 418 may have a plurality of optical elements and PV cells. As shown in FIG. 7, there may be a one-to-one ratio between optical elements 420 and PV cells 424. However, in alternative embodiments, a plurality of optical elements 420 may direct light rays L toward a corresponding one PV cell 424.

The common housing 430 may be globally aligned with a light source (not shown). Optionally, the common housing 430 may also be attached to a secondary alignment mechanism 432 that includes a module joint 434 and an actuator assembly 436. The module joint 434 may be attached to a support (not shown) of a tracking system.

In alternative embodiments, one optical element may direct light rays L toward a plurality of PV cells that are grouped together and proximate to the focal region of the optical element. The PV cells may be packed in a dense array and selectively movable by one or more module joints. For example, each PV cell may have a corresponding one module joint, a sub-group of PV cells may be supported by a module joint, or the entire group of PV cells may be supported by only one module joint. In other alternative embodiments, a plurality of optical elements may direct rays L toward a plurality of PV cells that are grouped together and proximate to the focal regions of the optical elements. Again, the PV cells may be packed in a dense array and selectively movable by one or more module joints.

In yet another alternative embodiment, the light concentrator 418 may include the array of optical elements 420 and an array of PV cells 424 that are not supported by module joints. In other words, the PV cells 424 may be arranged in fixed positions within the housing 430 or at a bottom of the housing 430. The common housing 430 may then be mounted to a tracking system, such as the tracking system 202 (FIG. 2), and be selectively movable by a secondary alignment mechanism.

As discussed above with respect to FIG. 6, each module joint 422 may be configured to support and selectively move one or more PV cells 424 resting thereon. For example, the PV cells 424 may be selectively moved by their respective module joints 422 so that the light rays L are impinging upon the PV cells at a desired incident angle. The desired incident angle may correlate to the highest current output of the corresponding PV cell 424. Alternatively, the PV cells 424 may be selectively moved by their respective module joints 422 to reduce a current mismatch between the PV cells 424 that may be electrically coupled in series. Each of the PV cells 424 may be communicatively coupled to a controller (not shown) to determine the desired orientation for each PV cell 424 in order to generate the desired output.

Figure 8:
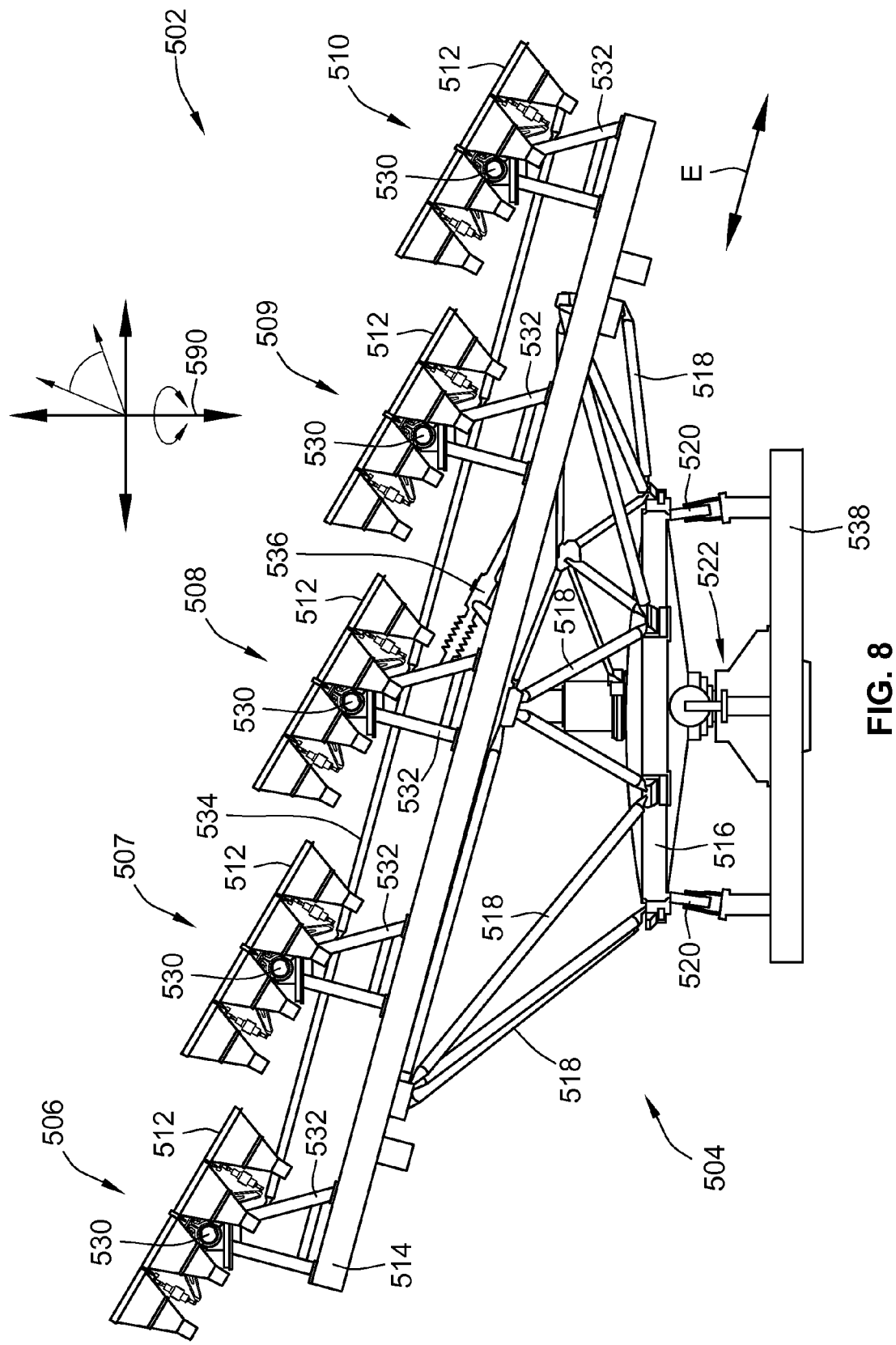
FIG. 8 is a side view of a tracking system formed in accordance with another embodiment.

FIG. 8 is a side view of a tracking system 502 formed in accordance with another embodiment that may be used with an LEC system, such as the LEC system 100 (FIG. 1). The tracking system 502 includes a tracking structure 504 that is configured to support and selectively move an array of LC modules 512. Although a particular embodiment of the tracking structure 504 is shown and described with reference to FIG. 8, the tracking structure 504 may vary in configuration and dimensions. For example, a configuration of the tracking structure 504 may be based, in part, on an environment in which the tracking structure 504 operates.

The LC modules 512 may be arranged in rows 506-510 (i.e., a plurality of LC modules 512 in each row 506-510 may be arranged along an axis that extends into the page). The tracking structure 504 may be capable of manipulating the orientation of the LC modules 512 (e.g., by tilting and/or rotating the LC modules 512) so that the LC modules 512 are globally aligned with a light source (not shown). The tracking structure 504 may include an inclined platform grid 514 (also referred to as a support structure) for holding the LC modules 512, a circular guide 516, and a plurality of support bars 518 that extend from the circular guide 516 to the inclined platform grid 514. The tracking structure 504 may be fabricated from any sturdy material, such as a plastic or a hollow metal alloy tube. The tracking structure 504 may also include a tracker base 538 that includes wheels 520 and a servo motor 522. The circular guide 516 may be coupled to the servo motor 522 for rotating the circular guide 516 and the tracking structure 504 about a vertical axis 590.

Furthermore, as shown in FIG. 8, each row 506-510 of the LC modules 512 may rest upon a rotatable beam 530 that is held by a corresponding stand 532. Each beam 530 may be movably coupled to a common rod or link 534 that extends along the platform grid 514. Another servo motor 536 may be coupled to the link 534 and configured to move the link 534 in a linear direction as indicated by the bi-directional arrow E. When the link 534 is moved along a linear direction, the beams 530 rotate about a beam axis 531 (shown in FIG. 9) thereby causing the LC modules 512 to tilt forward or backward. As such, the various components of the tracking structure 504 may cooperate with one another to selectively move (e.g., rotate and tilt) the array of LC modules 512 in order to globally align the LC modules 512 with a light source.

Figure 9:
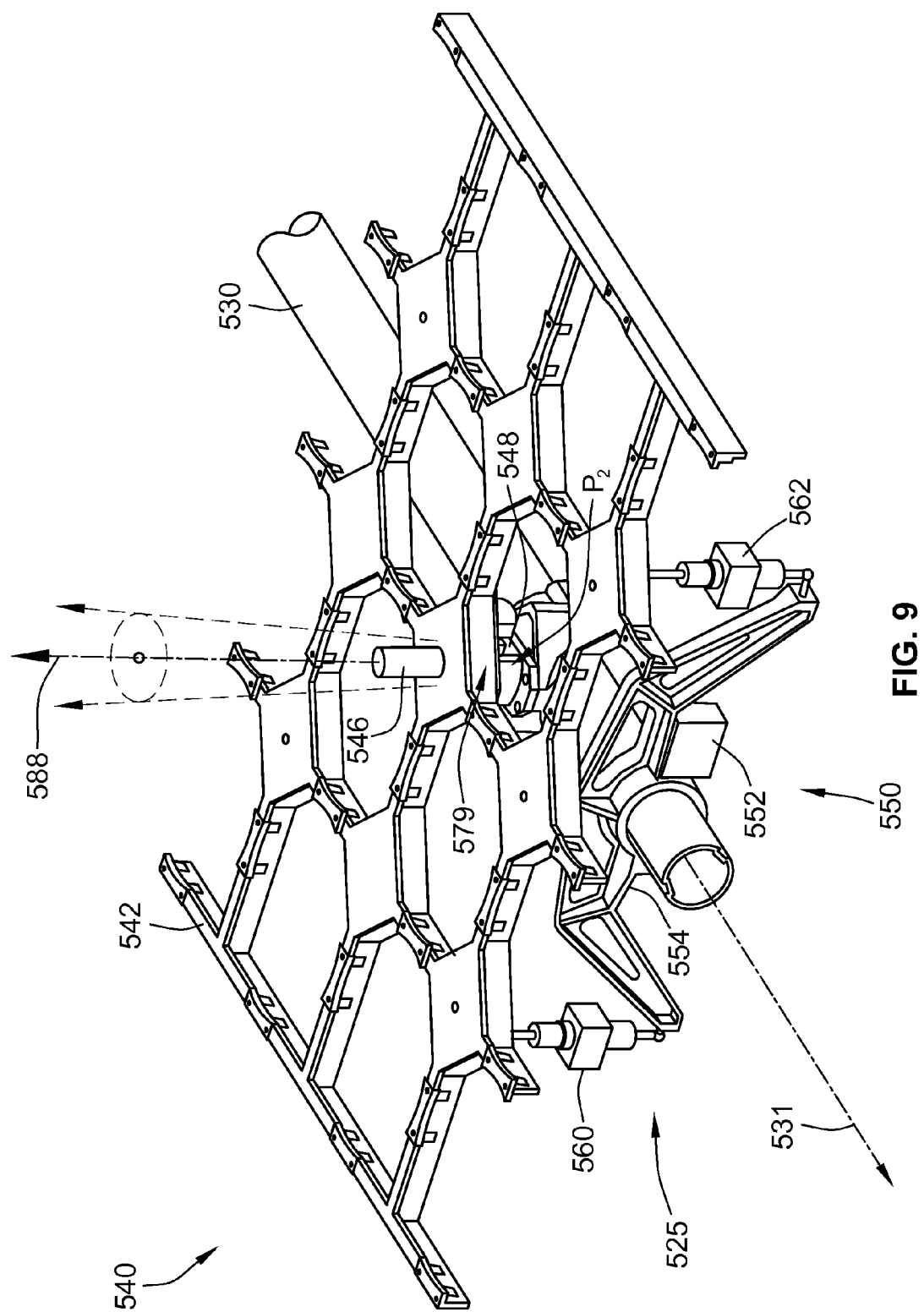
FIG. 9 is a perspective view of a frame module formed in accordance with one embodiment.
Figure 10:
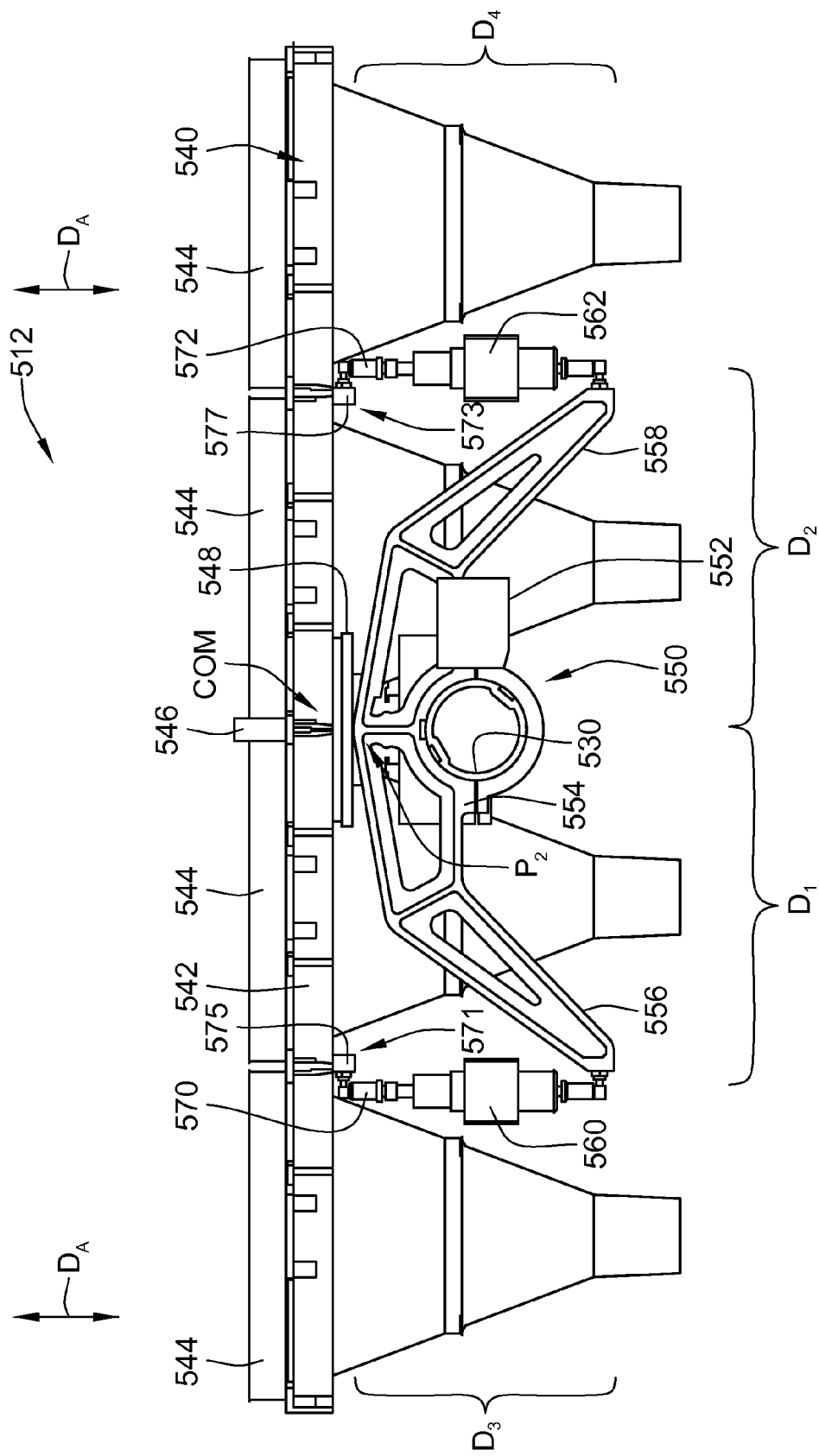
FIG. 10 is a side view of a LC module that may include the frame module shown in FIG. 9.

FIGS. 9 and 10 are a perspective view of a frame module 540 and a side view of the LC module 512, respectively. The frame module 540 includes a concentrator rack 542 that is configured to hold a plurality of light concentrators 544 (shown in FIG. 10) in fixed positions with respect to each other. The frame module 540 also includes a module joint 548 that directly and movably couples the concentrator rack 542 to the rotatable beam 530. The module joint 548 may be similar to the module joint 222 (FIG. 3) and may allow the concentrator rack 542 to be moved about two axes (not shown) relative to a pivot point $P_2$ of the module joint 548. Furthermore, the frame module 540 also includes an orientation detector 546 coupled to the concentrator rack 542 and an actuator assembly 550 that is coupled to the rotatable beam 530 and the concentrator rack 542. The actuator assembly 550 is configured to selectively move the frame module 540. As such, the actuator assembly 550 and the module joint 548 may form a secondary alignment mechanism 525 of the LC module 512.

Optionally, the frame module 540 may include a local microprocessor or controller 552. The local controller 552 may include modules similar to the modules 121-124 (FIG. 1) for controlling the frame module 540. The local controller 552 may be communicatively coupled to the orientation detector 546 and the actuator assembly 550. Optionally, the local controller 552 may also be communicatively coupled to other sensors or detectors of the frame module 540 or of other frame modules 540 on the tracking system 502 (FIG. 8). Furthermore, the local controller 552 may also be communicatively coupled to a central or system controller (not shown) that is associated with the tracking system 502 or with a plurality of tracking systems.

The orientation detector 546 is shown in FIG. 9 as a centrally located light sensor that may, for example, have four-quadrant luminance sensors that measure position error by measuring an amount of light falling on four individual luminance sensors. When the orientation detector 546 is a light sensor, the light sensor may have a fixed orientation with respect to the light concentrators 544. Alternatively or in addition to the light sensor, the orientation detector 546 may include a voltage detector that measures the actual output voltage of the LC module 512 or a current sensor that measures the current at predetermined nodes of an electrical circuit.

With reference to FIG. 10, the actuator assembly 550 includes a bracket 554 secured to the rotatable beam 530 and actuators 560 and 562 having arms 570 and 572, respectively. The bracket 554 has a pair of legs 556 and 558 that extend away distances $D_1$ and $D_2$, respectively, from each other and away from the rotatable beam 530. The legs 556 and 558 may also extend away from the concentrator rack 542 so that a separation distance $D_3$ and $D_4$ exists therebetween, respectively. In some embodiments, the distances $D_1$-$D_4$ may be configured so that a center of mass (COM) of the LC module 512 may be proximate to the beam 530 or another support structure. In such embodiments, the frame module 540 may be easier to manipulate than if the COM were further away from the beam 530.

Also shown, the LC module 512 may have an alignment axis 588. The actuators 560 and 562 may be moved between selected retracted and extended positions in order to move the LC module 512 about two axes relative to the pivot point $P_2$ of the module joint 548. In the illustrated embodiment, the actuators 560 and 562 are linear actuators that are configured to move the arms 570 and 572 a linear distance $D_4$ between retracted and extended positions. However, other types of actuators may be used in alternative embodiments.

Also shown in FIG. 10, the arms 570 and 572 are each coupled to the concentrator rack 542 at separate spatial locations 571 and 573 via actuator joints 575 and 577. The module joint 548 may be coupled to the concentrator rack 542 at a spatial location 579 (shown in FIG. 9). In the illustrated embodiment, the spatial locations 571 and 573 are peripherally located (i.e., away from a center of the concentrator rack 542) and the spatial location 579 is centrally located. As an example, the spatial locations 571 and 573 may be closer to an edge or side of the concentrator rack 542 than to a center of the concentrator rack 542. However, in other embodiments, the spatial locations may be separate, but grouped together.

The spatial locations 571 and 573 may be referred to as movable spatial locations, and the spatial location 579 may be referred to as a stationary spatial location. For example, the spatial locations 571 and 573 may be moved by the actuators 560 and 562, respectively, relative to the stationary spatial location 579 in order to move the LC module 512 about the spatial location 579. The relative positions of the spatial locations 571, 573, and 579 with respect to each other and the linear distance $D_4$ may all be configured for moving the LC module 512 (or frame module 540 or concentrator rack 542) about two axes relative to the pivot point $P_2$. The relative positions of the spatial locations 571, 573, and 579 may be configured so that the actuator assembly 550 may support the LC module 512 in different orientations throughout the lifetime of the tracking system 502 (FIG. 8).

Accordingly, in some embodiments, a secondary alignment mechanism (e.g., the secondary alignment mechanism 525) may be coupled to an LC module at a plurality of separate spatial locations. In particular, the secondary alignment mechanism may movably couple the LC module to a support structure (e.g., the beam 530) at the plurality of separate spatial locations. The plurality of spatial locations may include at least one movable spatial location and at least one stationary spatial location. As such, the LC module may have stronger or sturdier support than other LC modules that are not coupled to a support structure through a plurality of spatial locations. For example, a LC module that is movably coupled to a support structure at only one spatial location may be more vulnerable to wind than a LC module that is movably coupled to a support structure at a plurality of separate spatial locations.

In an alternative embodiment, the LC module 512 may not utilize a module joint 548, but, instead, may have a pair of actuator assemblies each having a pair of actuators. In such an embodiment, the spatial locations where the joints of the actuators couple to the concentrator rack 542 may form a rectangle or, more specifically, a square. The actuators may be configured to move corresponding arms a linear distance thereby moving the LC module 512 (or frame module 540 or concentrator rack 542) about a pivot point even though there is no module joint. Furthermore, other configurations and mechanical assemblies may be used for moving components about a pivot point.

Figure 11:
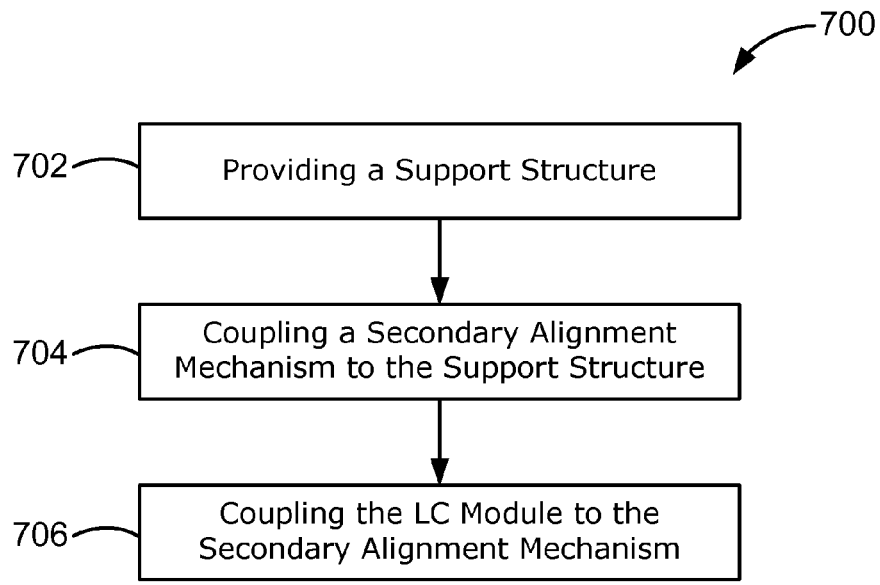
FIG. 11 illustrates a method of manufacturing a tracking system.

FIG. 11 illustrates a method 700 of manufacturing a tracking system that is configured to orient light concentrators to face a light source. The tracking system may be similar to the tracking systems 102 (FIG. 1), 202 (FIG. 2), and 502 (FIG. 8). The method 700 includes providing at 702 a support structure and coupling at 704 a secondary alignment mechanism to the support structure. For example, the secondary alignment mechanisms may include a module joint having similar features as the module joints described above and an actuator assembly, such as those described above. The method 700 also includes coupling an LC module at 706 to the secondary alignment mechanism. The secondary alignment mechanism may be configured to move the LC module about two axes relative to a pivot point of the module joint. The LC module may be similar to the LC modules described above and may be configured to hold an array of light concentrators in fixed positions with respect to each other. Furthermore, the method 700 includes coupling the LC module to the secondary alignment mechanism first, and then coupling the secondary alignment mechanism to the support structure.

Figure 12:
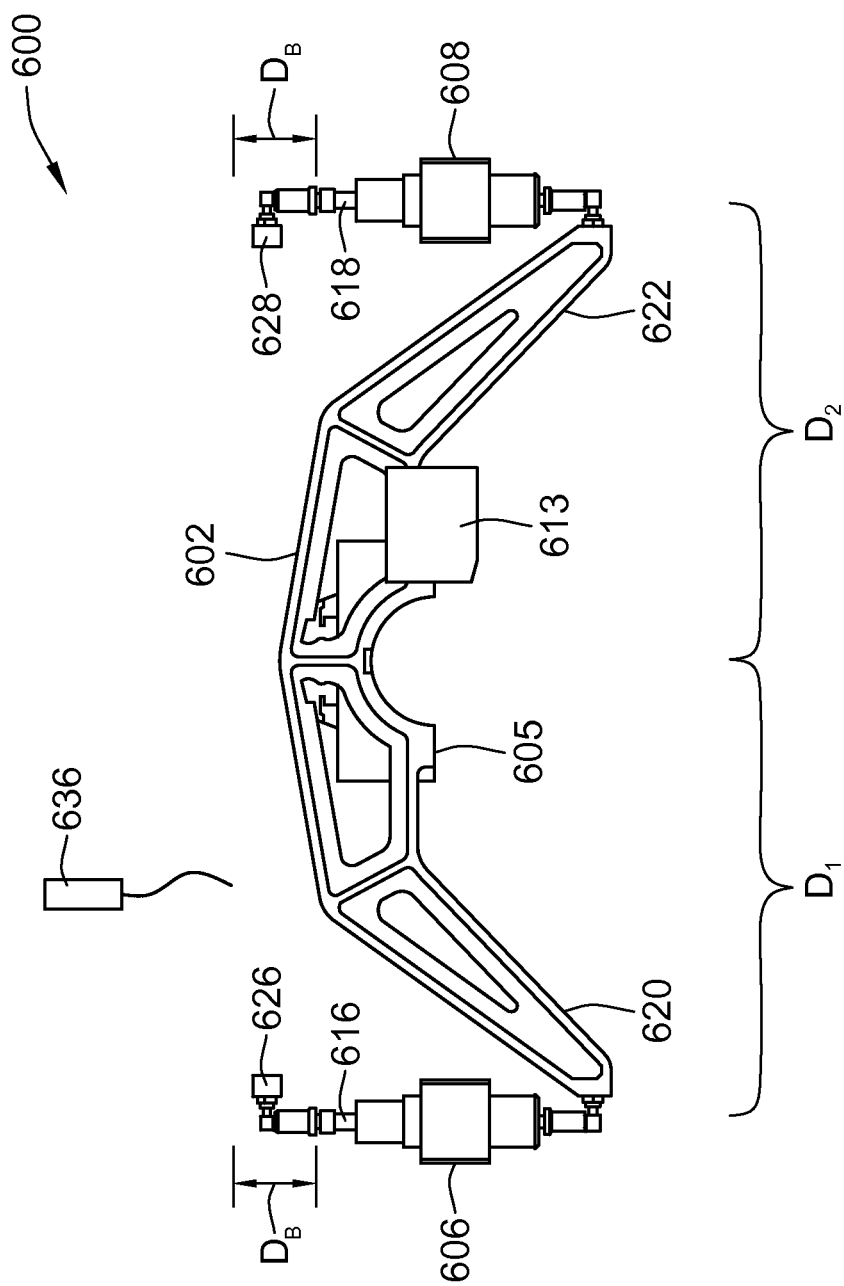
FIG. 12 is a schematic view of an actuator device formed in accordance with one embodiment.

FIG. 12 is a side view of a portable actuator device 600 formed in accordance with another embodiment. The portable actuator device 600 may enable a technician to visit a tracking system having LC modules or light concentrators that are movable about a pivot point(s) whether or not there is a module joint. The actuator device 600 may be used to initially orient the LC modules when a tracking system is manufactured or installed. Also, the actuator device 600 may be used as a maintenance tool for checking and re-orienting misaligned LC modules. The actuator device 600 may move or re-orient the LC modules or light concentrators to a desired orientation. Once in the desired orientation, the technician may secure the LC module or light concentrator to the desired orientation by using a fastening device (e.g., screw or latch).

Accordingly, the actuator device 600 may have similar features as the actuator assembly 550 (FIG. 10). For example, the actuator device 600 may includes a bracket 602 that includes a gripping element or device 605 that is configured to be mounted to or secured to a support structure. The bracket 602 has a pair of legs 620 and 622 that extend away distances D₁ and D₂, respectively, from each other. The actuator device 600 includes a pair of actuators 606 and 608 having respective arms 616 and 618.

In the illustrated embodiment, the actuators 606 and 608 are linear actuators that are configured to move the arms 616 and 618, respectively, a linear distance $D_B$ between retracted and extended positions. However, other types of actuators may be used in alternative embodiments. Also shown in FIG. 12, the arms 616 and 618 have actuator joints 626 and 628 configure to couple to a light concentrator or LC module (not shown). When the actuator device 600 is removably coupled to a support structure of the tracking system, the actuator joints 626 and 628 may be coupled to the light concentrator or LC module at separate spatial locations. In order to have an appropriate range for moving the light concentrator or LC module, the spatial locations of actuator joints 626 and 628 may need to be separated from a spatial location proximate to where the pivot point is located.

The actuator device 600 may also include a controller 613 that is configured to be communicatively coupled to orientation detector(s) of the light concentrator or LC module in order to determine a desired orientation of the light concentrator or LC module. Alternatively, the controller 613 may be communicatively coupled to a remotely located system controller of the tracking system, which may transmit information regarding the alignment of the light concentrator or LC module. The controller 613 may have a receiver and a transmitter for communicating wirelessly, or the controller 613 may be communicatively coupled through wires or cables (not shown) to the orientation detectors. Optionally, the actuator device 600 may include a local orientation detector 609 that may communicate with the controller 613. The orientation detector 609 may be configured to be mounted to the light concentrator and/or LC module and transmit alignment data to the controller 613.

Figure 13:
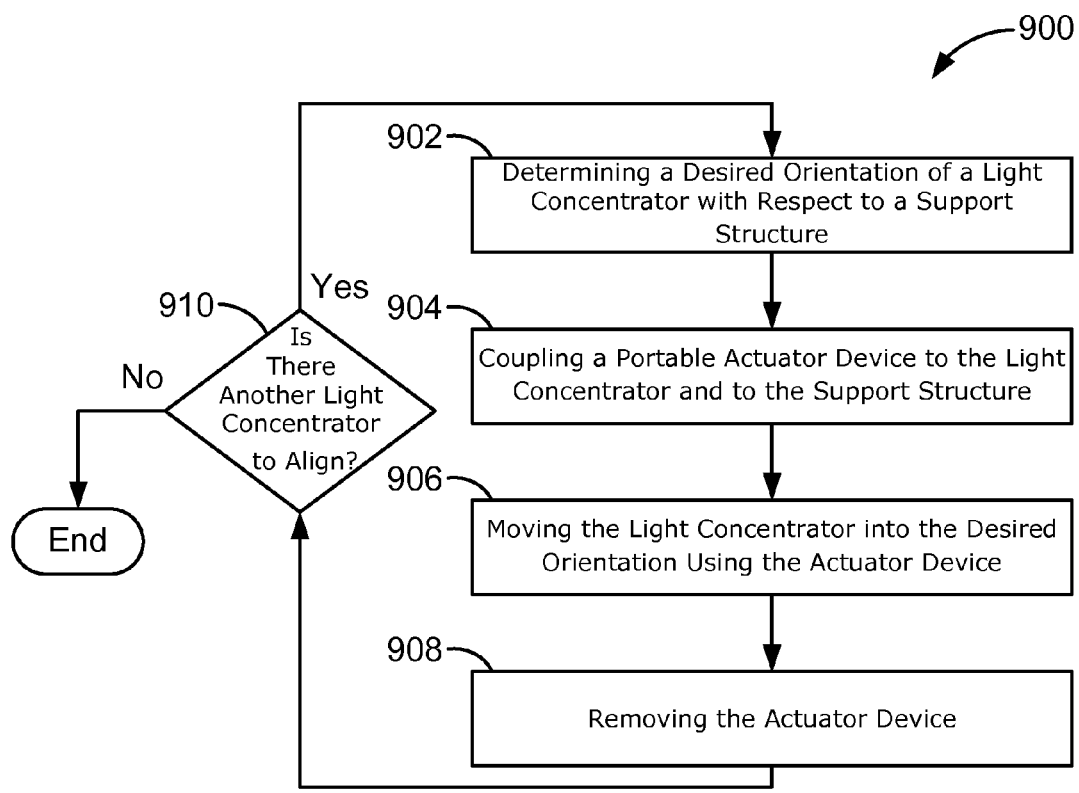
FIG. 13 is a flowchart illustrating a method for orienting light concentrators to track a light source.

FIG. 13 is a flowchart illustrating a method 900 for orienting a light concentrator to a light source. The method 900 includes determining at 902 a desired orientation of the light concentrator with respect to a support structure and. A portable actuator device may be coupled at 904 to the light concentrator and to the support structure. The method 900 also includes moving at 906 the light concentrator into the desired orientation using the actuator device and removing the actuator device at 908. At 910, it may be determined if there is another light concentrator to be aligned. If so, steps 902, 904, 906, and 908 may be repeated. Furthermore, method 900 may be applied to a LC module or a PV cell.

Figure 14:
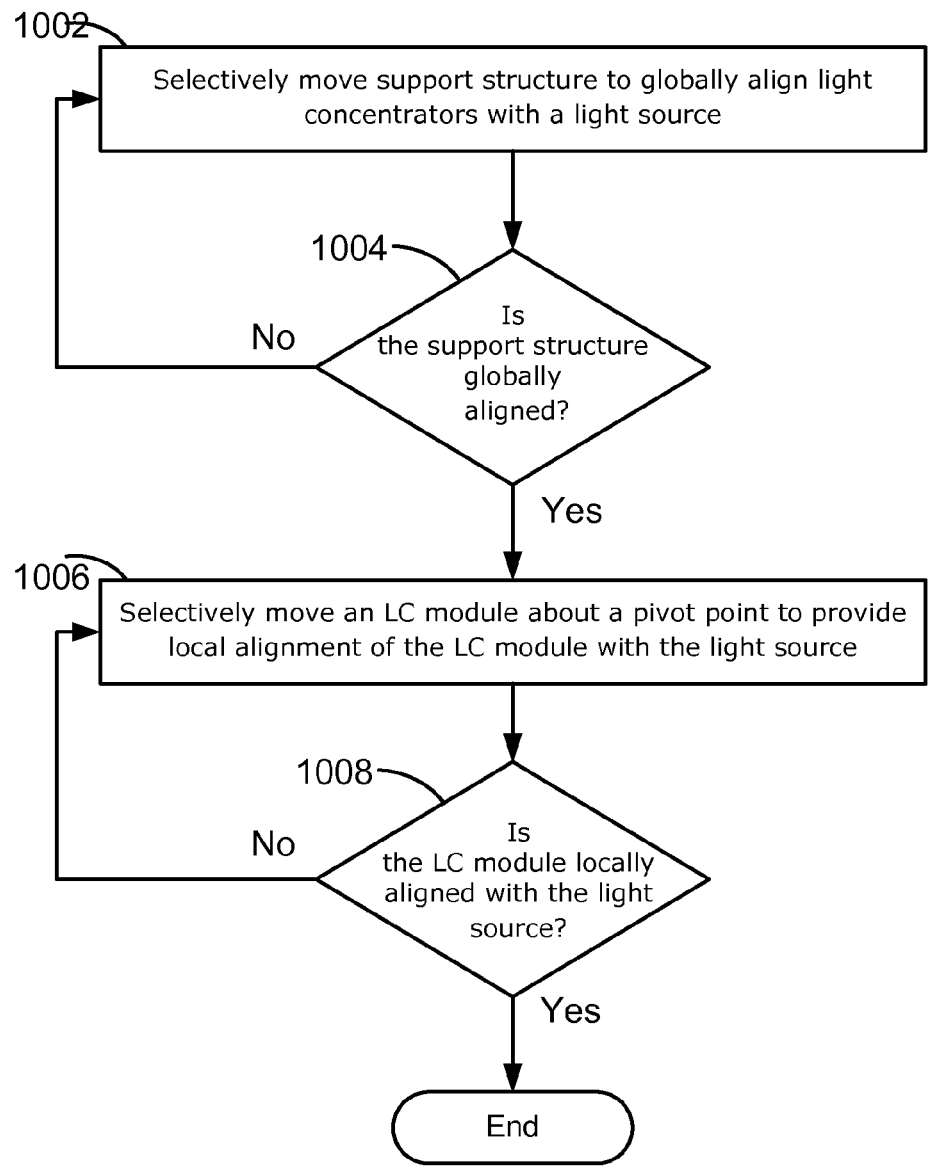
FIG. 14 is a flowchart illustrating a method for determining a desired orientation for a light concentrator.

FIG. 14 is a flowchart illustrating a method 1000 for orienting light concentrators to track a light source. The light concentrators may be components of a tracking system, such as the tracking systems 102 (FIG. 1), 202 (FIG. 2), and 502 (FIG. 8). The tracking system may include a support structure and a frame module supported by the support structure. The frame module may be movably coupled to the support structure by a module joint and has an array of light concentrators. The method 1000 includes selectively moving at 1002 the support structure to globally align the light concentrators with the light source. At 1004, a system controller or local controller may query whether the light concentrators are globally aligned. If not, the system may undergo a feedback protocol for globally aligning the light concentrators. The feedback protocols may use readings from inverters, light sensors, and/or current or voltage sensors.

The method 1000 also includes selectively moving at 1006 the LC module about two axes relative to a pivot point of the module joint to orient the light concentrators to face the light source. At 1008, a system controller or local controller may be queried as to whether the light concentrators are locally or more finely aligned. The selective movement may be controlled by a similar feedback protocol, which may use readings from a sub-inverter, light sensor, and/or current or voltage sensors.

In addition, many modifications may be made to adapt a particular situation or material to the teachings of the invention without departing from its scope. For example, although several embodiments were described as capable of including the module joint 222 as described with respect to FIG. 3, the module joint in other embodiments is not limited to that particular configuration. A module joint may be any joint capable of movably coupling two components and allowing at least one of the components to be moved about a pivot point of the module joint. For example, the module joint may be a universal joint, a ball joint, or simply a flexible material.

Furthermore, although several embodiments were described as having an actuator assembly that included linear actuators, other types of actuators or devices may be used. The actuator assembly must only be configured to move an LC module, a light concentrator, or a PV cell in a desired manner. As an example of one alternative embodiment, the actuator assembly may be coupled to the LC module at only one spatial location that is separate from the module joint. The actuator assembly may be configured to move that spatial location linearly as described above, but may also be configured to rotate the LC module about an axis that extends through the spatial location and the module joint. Furthermore, in other embodiments, more than one actuator assembly may be used to move an LC module about a module joint. Also, each actuator assembly may have any number of actuators, including only one actuator.

Also, although different features were discussed in detail above with reference to certain embodiments or components, those skilled in the art understand that these features may be combined with other features or added to other components.

Also, dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §212, sixth paragraph, unless and until such claim limitations expressly use the phrase "means for" followed by a statement of function void of further structure.

What is claimed is:

1. A tracking system configured to orient light concentrators to face a light source, the system comprising:
    a support structure for providing global alignment of the light concentrators with the light source;
    a plurality of light concentrator (LC) modules coupled to the support structure and having respective arrays of the light concentrators that are in fixed positions with respect to other light concentrators in the respective array, the support structure configured to rotate the plurality of LC modules about a first global axis and rotate the plurality of LC modules about a different second global axis to globally align the plurality of LC modules with the light source, wherein the first and second global axes are non-parallel; and secondary alignment mechanisms that are each coupled to the support structure and a respective LC modules, each of the secondary alignment mechanisms comprising a module joint that movably couples the respective LC module to the support structure and an actuator assembly, wherein the actuator assembly is configured to selectively move the respective LC module about first and second joint axes relative to a pivot point of the corresponding module joint thereby orienting the respective array of light concentrators of the respective LC module, wherein the secondary alignment mechanisms and the LC modules that are coupled to the secondary alignment mechanisms move as a group when the support structure rotates to globally align the light concentrators;

wherein the secondary alignment mechanisms are capable of selectively moving the LC modules independently with respect to one another such that different respective LC modules may be moved by different amounts.

2. The tracking system in accordance with claim 1 wherein the corresponding module joint is secured to a single spatial location of the respective LC module.

3. The tracking system in accordance with claim 1 wherein the corresponding module joint couples a center of the respective LC module to the support structure.

4. The tracking system in accordance with claim 1 wherein each of the LC modules of said plurality has a center of mass, the corresponding module joint being coupled to the respective LC module proximate to the center of mass.

5. The tracking system in accordance with claim 1 wherein the corresponding actuator assembly comprises an arm coupled to the respective LC module, the arm moving in a linear direction between extended and retracted positions to move the respective LC module about the pivot point.

6. The tracking system in accordance with claim 5 wherein the arm is a first arm and the corresponding actuator assembly comprises a second arm coupled to the respective LC module, the first and second arms and the corresponding module joint being coupled to the respective LC module at separate spatial locations.

7. The tracking system in accordance with claim 1 wherein each of the LC modules of said plurality is removably coupled to the support structure.

8. The tracking system in accordance with claim 1 wherein the support structure comprises a beam that extends along the second global axis, the beam supporting the plurality of LC modules, the beam being rotatable about the second global axis thereby rotating the plurality of LC modules about the second global axis.

9. The tracking system in accordance with claim 1 wherein the corresponding module joint comprises a housing, the corresponding actuator assembly being located within the housing of the corresponding module joint.

10. The tracking system in accordance with claim 1 wherein the plurality of LC modules are coupled to a common beam of the support structure.

11. The tracking system in accordance with claim 1 wherein at least one of the LC modules of said plurality is not coupled to a corresponding secondary alignment mechanism, the at least one LC module having a fixed orientation with respect to the support structure.

12. The tracking system in accordance with claim 1 wherein each of the LC modules of said plurality includes a light sensor having a fixed position with respect to the light concentrators of the corresponding LC modules.

13. The tracking system in accordance with claim 1 further comprising a local controller communicatively coupled to the actuator assembly, the local controller automatically moving the respective LC module when the respective LC module is misaligned with the light source.

14. The tracking system in accordance with claim 1 wherein the respective LC module is configured to face along an alignment axis toward the light source, the alignment axis and the first and second joint axes intersecting each other at the pivot point, each of the secondary alignment mechanisms moving the respective LC modules about the corresponding pivot points to align the respective LC modules.

15. The tracking system in accordance with claim 1 further comprising a system controller, wherein each of the LC modules of said plurality has a corresponding orientation detector associated therewith that is communicatively coupled to the controller, the orientation detector obtaining data relating to an alignment of the respective LC module with the light source, the controller receiving the data and determining whether the respective LC module is aligned or misaligned with the light source based on the alignment data.

16. The tracking system in accordance with claim 15 wherein the controller determines whether each of the LC modules of the plurality is aligned or misaligned with the light source based on at least one of an energy efficiency or an energy output of the respective LC module, wherein LC modules of said plurality that are determined to be misaligned are automatically moved to a different orientation.

17. The tracking system in accordance with claim 1 wherein at least some of the LC modules of said plurality include a concentrator rack that holds the respective array of light concentrators, the corresponding module joint being positioned between and movably coupling the corresponding concentrator rack and the support structure.

18. The tracking system in accordance with claim 1, wherein each of the LC modules of said plurality has a concentrator frame, the respective array of the light concentrators being coupled to the concentrator frame such that the light concentrators of the respective array are in fixed positions with respect to one another and the concentrator frame, wherein the secondary alignment mechanisms are capable of selectively moving the respective concentrator frames independently with respect to one another so that different LC modules may be moved by different amounts.

19. The tracking system in accordance with claim 1, wherein the first global axis constitutes an azimuthal axis and the second global axis constitutes a zenithal axis.

20. The tracking system in accordance with claim 1, wherein the plurality of LC modules is a first plurality and the tracking system further comprises a second plurality of the LC modules coupled to the support structure, each of the first and second pluralities of LC modules being rotated about respective second global axes when the first and second LC modules are globally aligned.

21. The tracking system in accordance with claim 1, further comprising first and second motors that are operably coupled to the plurality of LC modules, the first motor configured to rotate the plurality of LC modules about the first global axis, the second motor configured to rotate the plurality of LC modules about the second global axis.

* * * * *